US009697959B2

(12) United States Patent
Anderson et al.

(10) Patent No.: US 9,697,959 B2
(45) Date of Patent: Jul. 4, 2017

(54) GEOMETRIC SWITCH AND CIRCUITS INCLUDING THE SAME

(71) Applicant: Auckland UniServices Limited, Auckland (NZ)

(72) Inventors: Iain Alexander Anderson, Auckland (NZ); Thomas Gregory McKay, Auckland (NZ); Benjamin Marc O'Brien, Auckland (NZ); Todd Alan Gibsy, North Shore City (NZ)

(73) Assignee: Auckland UniServices Limited, Auckland (NZ)

( * ) Notice: Subject to any disclaimer, the term of this patent is extended or adjusted under 35 U.S.C. 154(b) by 0 days.

(21) Appl. No.: 14/432,111

(22) PCT Filed: Sep. 26, 2013

(86) PCT No.: PCT/NZ2013/000179
§ 371 (c)(1),
(2) Date: Mar. 27, 2015

(87) PCT Pub. No.: WO2014/051439
PCT Pub. Date: Apr. 3, 2014

(65) Prior Publication Data
US 2015/0287552 A1    Oct. 8, 2015

(30) Foreign Application Priority Data

Sep. 26, 2012   (AU) ................................ 2012904200

(51) Int. Cl.
*H01C 10/12*    (2006.01)
*H01H 1/24*    (2006.01)
(Continued)

(52) U.S. Cl.
CPC ............ *H01H 1/242* (2013.01); *H03K 17/965* (2013.01); *H03K 17/9625* (2013.01); *H01C 10/10* (2013.01); *H03K 17/9645* (2013.01)

(58) Field of Classification Search
CPC . H01G 5/00; H01G 5/16; H01G 11/04; H01G 11/28; H01G 11/48; H01G 11/70;
(Continued)

(56) References Cited

U.S. PATENT DOCUMENTS 3,806,471 A * 4/1974 Mitchell .................... G01L 1/20
200/511
6,646,540 B1 * 11/2003 Lussey ................. H01C 10/106
338/114

(Continued)

FOREIGN PATENT DOCUMENTS

WO   WO-2011/105913    9/2011
WO   WO-2014/051439    4/2014

OTHER PUBLICATIONS

"International Application No. PCT/NZ2013/000179, International Preliminary Report on Patentability issued Apr. 9, 2015", 5 pgs.

(Continued)

*Primary Examiner* — Kyung Lee
(74) *Attorney, Agent, or Firm* — Schwegman Lundberg & Woessner, P.A.

(57) ABSTRACT

The present invention provides a mechanically-actuated switch comprising a deformable conductive element providing a conductive path between a first terminal and a second terminal, wherein the effective geometry of the conductive element changes suddenly upon deformation to cause a disproportionately large change in a resistance between the first and second terminals. The switch can be made from lightweight and soft materials, and is particularly suited for integration with dielectric elastomer devices. Also disclosed (Continued)

are various circuits and a method for controlling circuits including the switch.

21 Claims, 6 Drawing Sheets

(51) Int. Cl.
*H03K 17/96* (2006.01)
*H03K 17/965* (2006.01)
*H01C 10/10* (2006.01)

(58) Field of Classification Search
CPC .......... H01G 4/015; H01G 4/18; H01C 10/10; H01C 17/06586; H01C 7/028
USPC ........................................................ 338/114
See application file for complete search history.

(56) References Cited

U.S. PATENT DOCUMENTS

| | | | |
|---|---|---|---|
| 6,768,246 B2* | 7/2004 | Pelrine | F02G 1/043 310/317 |
| 7,080,562 B2* | 7/2006 | Knowles | G01N 3/12 338/114 |
| 8,638,024 B2* | 1/2014 | Anderson | H01L 41/0986 310/323.02 |
| 2002/0175594 A1* | 11/2002 | Kornbluh | B60G 17/01941 310/317 |
| 2008/0212262 A1* | 9/2008 | Micallef | H01G 9/028 361/502 |
| 2008/0218132 A1* | 9/2008 | Pelrine | H02N 11/002 322/2 A |
| 2012/0299514 A1* | 11/2012 | Anderson | H01L 41/107 318/116 |
| 2013/0100575 A1* | 4/2013 | O'Brien | H02N 2/181 361/283.1 |

OTHER PUBLICATIONS

"International Application No. PCT/NZ2013/000179, International Search Report and Written Opinion mailed Jan. 9, 2014", (Jan. 9, 2014), 10 pgs.

\* cited by examiner (a)

(b)

GEOMETRIC SWITCH AND CIRCUITS INCLUDING THE SAME

PRIORITY CLAIM TO RELATED APPLICATIONS

This application is a U.S. national stage application filed under 35 U.S.C. §371 from International Application Serial No. PCT/NZ2013/000179, which was filed Sep. 26, 2013, and published as WO 2014/051439 on Apr. 3, 2014, and which claims priority to Australia Application No. 2012904200, filed Sep. 26, 2012, which applications and publication are incorporated by reference as if reproduced herein and made a part hereof in their entirety, and the benefit of priority of each of which is claimed herein.

FIELD OF THE INVENTION

This invention relates to a switch having a geometry or physical arrangement giving rise to a substantial change in resistance upon mechanical deformation. In particular, the invention relates to a soft or flexible switch and circuits including the same.

BACKGROUND

Conventional electronic components such as transistors, switches, logic components and the like, are relatively heavy and rigid, and typically mounted to a rigid fibreglass printed circuit board (PCB). However, there is a growing need for "soft" or flexible electronics.

Dielectric elastomer devices (DED), for example, are transducers which utilize high voltage, low current electric charge to convert between mechanical and electrical energy, comprising a deformable dielectric membrane between opposing compliant electrodes. The devices have in the past been be used as actuators (referred to as a dielectric elastomer actuator or DEA) or generators (referred to as a dielectric elastomer generator or DEG).

One of the advantages of DEDs is that they are lightweight and flexible, making them particularly suited to applications where traditional actuators and/or generators are not possible or practical. However, control of DEDs generally requires conventional and relatively heavy and rigid electronic components which negate some of the advantages of the DED.

International Patent Publication No. WO 2011/105913 discloses an electric circuit device comprising a conductive element coupled to a deformable body, the conductive element having variable resistivity based at least in part on deformation of the deformable body. The variable resistivity or piezoresistivity of the conductive element is achieved using a composite of conductive particles in a non-conductive matrix. As the DED membrane stretches, the density of conducting particles also changes, and due to percolation the resistivity may change by orders of magnitude. In particular, substantial changes in resistance occur at the percolation threshold.

The electric circuit device of WO 2011/105913 may therefore be used as a dielectric elastomer switch (DES), enabling analogue and/or digital or Boolean circuitry to be integrated into the dielectric elastomer device. Doing so provides "soft" electronics for controlling an actuator or generator without any external circuitry, eliminating off-membrane circuitry and permitting simple fabrication (the DED and conducting element or sensor being made of the same materials, in the same process).

A DES is useful for switching high voltage signals and can be printed onto dielectric elastomer surfaces using the same technology for making the DEDs themselves.

However, the soft switches of the prior art (including WO 2011/105913) generally suffer from one or more disadvantages which may include unpredictable or inconsistent behaviour, linearity in the resistance/deformation relationship, unsuitability for integration with DEDs, the need for hand fabrication, and/or difficulties in automating fabrication.

OBJECT OF THE INVENTION

It is therefore an object of the invention to provide a switch which overcomes or at least ameliorates one or more disadvantages of the prior art, or alternatively to at least provide the public with a useful choice.

Further objects of the invention will become apparent from the following description.

SUMMARY OF INVENTION

Accordingly, in a first aspect the invention may broadly be said to consist in a mechanically-actuated switch comprising a deformable conductive element providing a conductive path between a first terminal and a second terminal, wherein the effective geometry of the conductive element changes suddenly upon deformation to cause a disproportionately large change in a resistance between the first and second terminals.

In a second aspect the invention may broadly be said to consist in a circuit comprising a switch according to the first aspect, an input, and an output, wherein the circuit is configured to provide at the output an output signal dependent upon at least an input signal received at the input and the deformation of the conductive element of the switch.

In a third aspect, the invention may broadly be said to consist in method for controlling a circuit, comprising steps of:
  providing the circuit with a switch according to the first aspect;
  providing an input signal to the switch; and
  selectively subjecting the switch to a deformation force, thereby actuating said switch and producing an output signal dependent upon at least the input signal and deformation of the switch.

in a fourth aspect the invention may broadly be said to consist in a switch comprising:
  a deformable membrane; and
  a conductive element electrically coupling a first terminal to a second terminal, the conductive element being mechanically coupled to the membrane whereby deformation of the membrane in at least a first direction deforms the conductive element in said first direction;
  wherein the conductive element is deformed from a substantially direct conductive path in a relaxed state to a substantially tortuous path or separated conductive path when the membrane is stretched in the first direction, thereby substantially increasing the resistance of the conductive element between the first and second terminals.

Preferably the resistance of the switch increases by a factor of at least ten upon stretching.

Preferably the membrane comprises a dielectric elastomer.

Preferably the effective length of the conductive path increases disproportionately with respect to the stretch of the membrane, whereby the resistance/stretch relationship is non-linear.

In a fifth aspect, the invention may broadly be said to consist in a switch comprising:
- a deformable membrane; and
- a conductive element mechanically coupled to the membrane whereby deformation of the membrane in at least a first direction deforms the conductive element in said first direction,
- wherein the conductive element comprises a plurality of connected segments in a zigzagging arrangement whereby each segment is adapted to contact and conduct with adjacent segments when the membrane is in a relaxed state to provide a shortened conductive path, and to deform to a substantially elongated tortuous conductive path when the membrane is stretched in the first direction, thereby substantially increasing the resistance of the conductive element.

In a sixth aspect, the invention may broadly be said to consist in a switch comprising:
- a deformable membrane; and
- a conductive element mechanically coupled to the membrane whereby deformation of the membrane in at least a first direction deforms the conductive element in said first direction,
- wherein the conductive element comprises a plurality of substantially parallel transverse segments whereby each segment is adapted to contact and conduct with adjacent segments when the membrane is in a relaxed state to provide a conductive path, and to separate when the membrane is stretched in the first direction, thereby substantially increasing the resistance of the conductive element.

Preferably the switch further comprises a conductive encapsulation layer adjacent the conductive element, said encapsulation layer preferably providing a high-resistance conductive path between said separated segments in the stretched state to prevent electrical sparking.

In a seventh aspect, the invention may broadly be said to consist in a switch comprising:
- a deformable membrane; and
- a compliant conductive layer mechanically coupled to the membrane whereby deformation of the membrane in at least a first direction deforms the conductive element in said first direction,
- wherein the conductive layer comprises a plurality of transverse incisions extending inwardly from alternate sides of the conductive element, said incisions being adapted to remain closed to conduct current when the membrane is in a relaxed state, and to open when the membrane is stretched in the first direction to provide a substantially elongated tortuous conductive path. Said incisions may be provided in the conductive layer alone, or both the conductive layer and the deformable membrane.

In a eighth aspect, the invention may broadly be said to consist in a three-dimensional geometric switch comprising at least one elongate planar conductive strip folded back upon itself in alternate directions, wherein adjacent folded sections of the conductive strip are adapted to contact and conduct current substantially in a through-plane direction to provide a shortened conductive path when compressed, and to provide a substantially elongated tortuous conductive path when stretched.

Preferably, the three-dimensional geometric switch comprises a pair of braided elongate planar conductive strips.

In a ninth aspect, the invention may broadly be said to consist in a switch comprising:
- a deformable membrane adapted to be deformed in at least a first direction; and
- a conductive metal layer upon or within the deformable membrane, wherein the conductive metal layer comprises a plurality of fissures, said fissures being adapted to remain closed when the membrane is in a relaxed state to provide a substantially linear or planar conductive path between opposing ends of the conductive layer, and to open when the membrane is stretched in the first direction to provide a substantially tortuous and/or separated conductive path.

Preferably said fissures are microscopic.

Preferably the circuit further comprises a conductive encapsulation layer adjacent the conductive element, said encapsulation layer providing a high-resistance conductive path across said fissures in the stretched state to prevent electrical sparking.

The encapsulation layer preferably comprises a composition of carbon grease and non-conducting silicone grease, preferably at a ratio of between approximately 2:1 and 4:1.

Preferably the conductive metal layer is microscopic.

Preferably the conductive metal layer comprises a layer of silver, and in particular a nanometre-scale layer of silver.

In a tenth aspect, the invention may broadly be said to consist in a circuit comprising a switch according to any of the first to sixth aspects of the invention, the circuit being configured to provide an output signal dependent upon at least an input signal and the deformation of the conductive element of the switch.

Preferably the circuit further comprises at least one dielectric elastomer device mechanically and/or electrically coupled to the switch.

Preferably the dielectric elastomer device comprises a dielectric elastomer actuator (DEA) mechanically coupled to the switch, wherein the switch is actuated by said DEA.

Alternatively, the dielectric device may comprise a dielectric elastomer actuator (DEA) electrically coupled to the switch, wherein actuation of the DEA is controlled by the switch.

Preferably the circuit further comprises a high voltage power supply.

In one preferred embodiment the circuit may comprise an inverter, wherein the DEA is electrically actuated by the input signal and mechanically actuates the switch to selectively provide a high or low voltage as said output signal.

In another preferred embodiment, the circuit may comprise a ring oscillator comprising a plurality of said inverters.

In yet another preferred embodiment, the circuit may comprise an oscillating motor comprising a plurality of dielectric elastomer actuators sequentially actuated by a plurality of switches.

In other embodiments, the circuit may comprise one or more of an AND gate, a NOT gate, a NAND gate, a voltage clamp, a diode, a summing junction, a neuron or weighted summing junction, a latch, a buffer, an operational amplifier, a frequency multiplier, a Schmitt trigger, an oscillator, and a low current driver.

Preferably the switch shares a membrane with at least one dielectric elastomer device.

In an eleventh aspect, the invention may broadly be said to consist in a method for controlling a circuit, the method comprising the steps of:

providing the circuit with a switch according to the first aspect of the invention;

providing an input signal to the circuit; and subjecting the switch to a deformation force in at least the first direction, thereby actuating said switch and producing an output signal dependent upon at least said input signal and said deformation force.

In a twelfth aspect the invention may broadly be said to consist in a switch providing a high resistance or reactance or a low resistance or reactance, the switch comprising one or more elastic layers and one or more conductive layers, wherein the conductive layer is configurable between two states by deformation of the switch and wherein the one or more elastic layers provide a mechanical bias towards the first state, and wherein the one or more conductive layers provide one or more continuous conduction paths between two terminals when in the first state, the continuous paths providing low resistance or reactance, and wherein one or more of the one or more conductive layers has at least one discontinuity when in the second state such that the at least one discontinuity provides a high resistance or reactance for the one or more conductive paths, whereby a deformation force applied to the switch will configure the switch in the second state and the switch will provide a high resistance or reactance and whereby cession of the deformation force will allow the switch to return to under bias of the one or more elastic layers to the first state and the switch provides a low resistance.

The one or more conductive layers may provide a tortuous conductive path around the one or more discontinuities to provide a high resistance when the switch is in the second state.

The one or more conductive layers may include a series of discontinuities.

Preferably the electric circuit device forms a logic circuit.

Further aspects of the invention, which should be considered in all its novel aspects, will become apparent from the following description.

DRAWING DESCRIPTION

A number of embodiments of the invention will now be described by way of example with reference to the drawings in which.

DETAILED DESCRIPTION OF THE DRAWINGS

Figure 1:
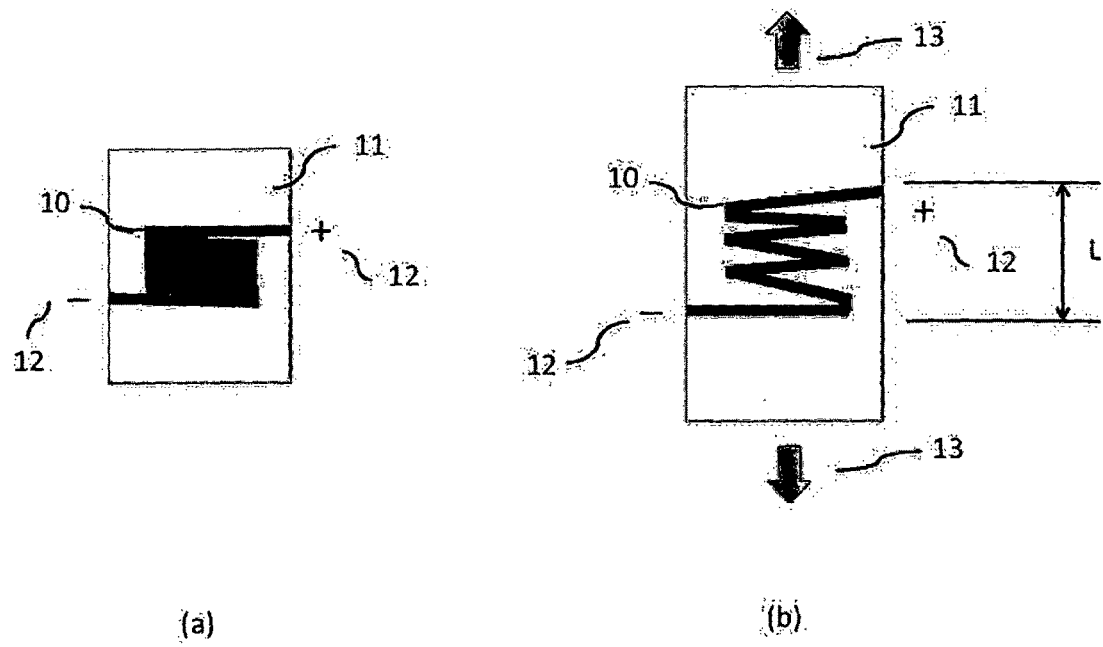
FIG. 1 is a diagram of a first embodiment of a switch according to the present invention, shown in: (a) relaxed; and (b) stretched states.

Throughout the description like reference numerals will be used to refer to like features in different embodiments.

Broadly speaking, the present invention provides a mechanically-actuated switch comprising a conductive element which effectively changes geometry upon deformation, disproportionately increasing the resistance of the switch with respect to the deformation. That is, it is not merely the dimensions of the conductive element of the switch which change upon deformation, but the effective shape of the conductive element and conductive path therethrough (e.g. from a substantially planar rectangular conductive element to an elongated tortuous, serpentine, or meandering conductive element, or one comprising a plurality of openings). The present invention thus does not rely solely upon a piezoresistive effect. The switch may be used in a wide variety of circuits to selectively couple and/or decouple an input signal to an output terminal, for example.

The terms "geometry" and "shape" for the purpose of the following description and claims refer to the geometric features of the conductive element other than merely side/edge length, scale or aspect ratio which invariably change upon stretching of any shape. The particular geometric features which change in various embodiments of the present invention might include one or more of the effective or apparent number of corners, edges, segments (e.g. non-contiguous portions), or apertures (e.g. spaces enclosed by the shape) of the conductive element, for example. Other such features will be apparent to the skilled person. In contrast, the switches disclosed in WO 2011/105913 rely upon merely a change in dimensions or density (percolation effect) of the conductive element, without any such change in the aforementioned geometric features.

It is to be appreciated that the terms "open" or "off" and "closed" or "on" may be relative and not require complete opening or closing of a circuit according to the present invention. It is sufficient that the switch transforms from being highly conductive to highly resistive (or vice versa) upon actuation.

The term "relaxed" as used throughout the description and claims refers to the typical or normal conductive state of the membrane in the absence of a variable or intermittent deformation force deforming the membrane to actuate the switch. In at least some embodiments, the membrane may be pre-stretched by a certain amount, and therefore may never be fully relaxed. The term "relaxed" thus refers also to this pre-stretched conductive equilibrium state, in the absence of an additional deformation force further stretching the membrane to actuate the normally-closed switch. Alternatively, the switch may be biased or stretched to substantially open the switch, in which case the normally-open switch is returned to a "relaxed" state upon application of an opposing deformation force. Other such variations of the switch are possible without departing from the scope of the invention, and will be apparent to those skilled in the art.

A first embodiment of a switch according to the present invention is shown in FIG. 1 as an example of what is referred to as a planar geometric dielectric elastomer switch (GDES). The GDES comprises an electrode or conductive element 10 provided (printed or deposited, for example) on, and mechanically coupled with, a deformable insulating substrate or membrane 11. In at least some applications, the insulating membrane may be the dielectric membrane of a dielectric elastomer device (DED) for example.

Opposing ends of the conductive element 10 comprise the positive and negative terminals 12 of the GDES. In the relaxed state as shown in FIG. 1(*a*), the conductive element 10 is in a compressed accordion-like concertinaed or zigzag "folded" arrangement, whereby the substantially transverse, parallel segments between consecutive "folds" of the conducting element contact and conduct with adjacent segments along substantially their entire length. In effect, the conductive element is thus substantially rectangular. This provides a shortened and substantially direct conductive path for electrical conduction between terminals 12, and the GDES is thus highly conductive.

The distance between terminals 12, referred to as the length L, of the conductive element 10 is relatively short until the membrane 11 is stretched in the direction indicated by arrows 13.

The folds in the conductive element define a plurality of openings in alternating sides thereof which are substantially closed in the relaxed state but open upon stretching of the membrane and conductive element (which is mechanically coupled to the membrane). This causes a significant step-wise-like increase in resistance between the terminals as the openings separate upon deformation.

In other words, the electrical connection along the length of the adjacent parallel segments in the relaxed states enables current to bypass the full length of the conductive element which only becomes apparent or effective upon deformation.

FIG. 1(*b*) shows the same GDES in the stretched state, showing the change in geometry. As the conductive element 10 is stretched, gaps open between the consecutive folds and the conducting element 10 becomes substantially elongate with a wave-like "W" shape. It can be seen that the effective length L of the conductive path provided by conductive element 10 is substantially increased and, significantly, there is no shortened path of electrical conduction between terminals 12. That is, upon deformation of the conductive element 10 in a first direction, the conductive path becomes elongated in a substantially orthogonal second direction as the current must follow a meandering or tortuous path between the terminals. The resistance of the conductive element 11 in this state is preferably so great, and the increase so significant, that the conductive element in effect becomes a switch which effectively breaks the electrical circuit when stretched sufficiently in the direction of arrows 13. The resistance required for this will depend upon the application of the switch. That is, the GDES is "closed" or conducting in the relaxed state of FIG. 1(*a*), and effectively "open" or substantially non-conducting (highly resistive) in the stretched state of FIG. 1(*b*).

In effect, the geometry of the conductive element 10 is deformed from a substantially direct linear or planar conductive path between terminals 12 in a relaxed state to a substantially elongated tortuous or indirect conductive path in a stretched state, thereby substantially increasing the resistance of the conductive element between the first and second terminals when the membrane is stretched in the first direction 13. Not only is the distance or length L between the terminals of the conductive element increased, but current is conducted only along the substantially transverse segments of the conductive element rather than directly between adjacent segments. The resistance and effective length (i.e. following the substantially transverse segments) of the conductive element thus increases disproportionately with respect to the stretch in the membrane, and the resistance/stretch relationship is highly non-linear.

The resistance R of the GDES is a function of resistivity p, cross-sectional area A, and length L of the conductive element 10, as defined by the equation:

$$R = \rho \frac{L}{A}$$

The length L of the accordion-like conductive element is greatly increased by straightening its folds, while the cross-sectional area A will be simultaneously reduced. These effects combine to provide large resistance changes.

This geometric resistance change can be estimated. If the conductive element in its relaxed state has a thickness t, width W and height H and there are n folds in the switch then the resistance when on will be:

$$R_{on} = \rho \frac{H}{Wt}$$

When off, the resistance will be:

$$R_{off} = \rho \frac{Wn}{(H/n)t}$$

The resistance change ratio associated with the geometric change is thus given approximately by the equation:

$$\frac{R_{on}}{R_{off}} = \frac{H^2}{W^2 n^2}$$

Accordingly, the lower the aspect ratio (H/W) and higher the number of folds (n), the greater the resistance change ratio will be.

In this and various other embodiments of the invention described herein by way of example, the parallel segments of the conductive element are shown provided in a substantially transverse direction with respect to the expected direction of deformation, wherein the highly-conductive configuration of FIG. 1(*b*) is converted to a highly-resistive configuration upon deformation. In other embodiments, however, the parallel segments may be provided such that they are substantially parallel with the expected direction of deformation, but spaced apart so that they are in the highly-resistive configuration in the relaxed equilibrium state. Deformation of the conductive element will thus bring the parallel segments closer together until the geometry changes to the highly-conductive configuration, thereby providing a normally-open switch rather than the normally-closed switch of FIG. 1.

Figure 2:
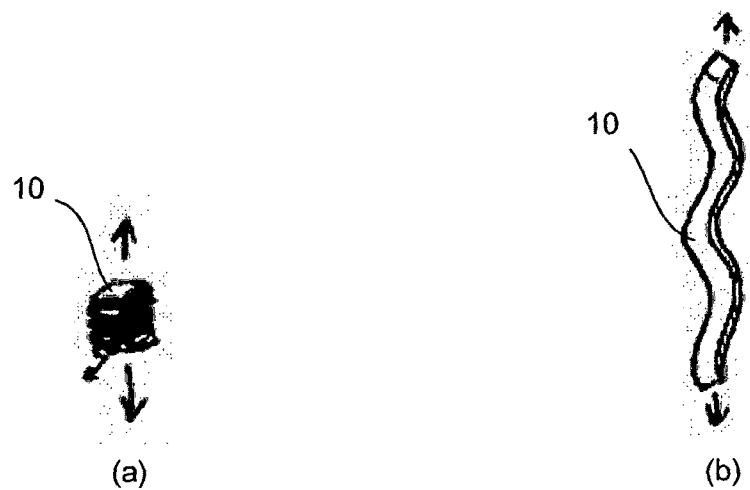
FIG. 2 is a diagram of a second embodiment of a switch according to the present invention, shown in: (a) relaxed; and (b) stretched states.
Figure 3:
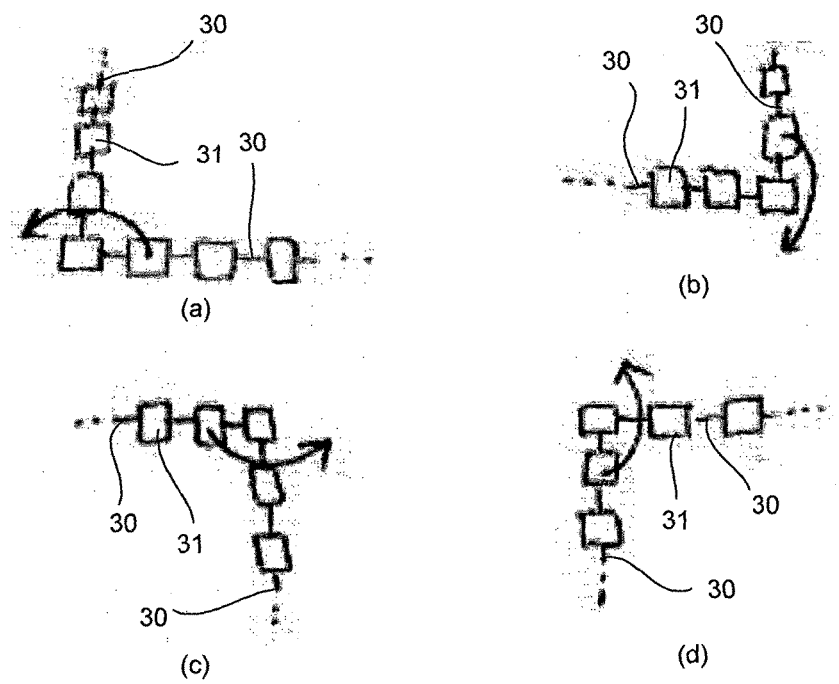
FIG. 3 shows a diagram of the process sequential steps (a)-(d) for forming the braided conductive element of the switch of a third embodiment of a switch according to the invention.

A second embodiment of a switch according to the present invention is shown in FIG. 2, as an example of a switch having a three dimensional structure rather than the planar structure of the first embodiment.

In this second embodiment, the switch comprises a pair of elongate conductive strips 30 braided together to form the conductive element 10. In the compressed, relaxed, or "on" state of FIG. 2(a), the overall length of the switch is relatively short and the substantially planar segments of the conductive strips between consecutive "folds" contact and conduct with corresponding segments of the other conductive element 10 both above and below, providing a shortened direct conductive path between opposing ends of the conductive strip (i.e. each segment conducting current in the through-plane direction). When the switch is stretched in the direction indicated by the arrows to the "off" state as shown in FIG. 2(b), the effective geometry of the switch changes substantially and the effective length of the switch suddenly increases significantly. There is no longer a shortened or direct conductive path between the terminals. Rather, openings in the conductive element 10 form between the pair of conductive strips. These openings close when the conductive element returns to the relaxed or compressed state.

The resistance of the braided switch can also be estimated. For a double-braided switch as shown in FIG. 2, the relaxed/on state resistance is given by:

$$R_{on} = \rho \frac{nt}{W^2}$$

That is, the overall length L of the switch is approximately the number of folds n multiplied by the thickness per fold t, and the cross-sectional area A is the area of each segment between consecutive folds—the fold edge length W, squared.

The stretched/off state resistance is given by:

$$R_{off} = \rho \frac{nW}{2Wt} = \rho \frac{n}{2t}$$

That is, the overall length of the switch is approximately the number of folds n multiplied by the fold edge length W, and the area for conduction is the cross-sectional area of each conductive element 10—the fold edge length W multiplied by the thickness t, doubled (for two conductive elements 10).

The resistance change ratio for this second embodiment is thus given by:

$$\frac{R_{on}}{R_{off}} = \frac{2t^2}{W^2}$$

The resistance change ratio in this case is thus independent of the number of folds n. Accordingly, the greater the fold edge length W and smaller the thickness t is, the greater the resistance change ratio will be.

To produce the braided switch of FIG. 2, corresponding ends of each conductive strip 30 are placed orthogonally, one on top of the other, then alternately folded back over the other conductive element as shown diagrammatically with respect to a third embodiment of the invention in FIGS. 3(a)-(d).

In a third embodiment of the invention, the switch comprises a pair of conductive strips braided together as in the second embodiment. However, each conductive strip comprises a plurality of substantially planar conductive regions 31 sequentially coupled in a chain by conductive pathway 30. The conductive regions 31 are preferably square, and the conductive pathway 30 has a reduced width and thus greater resistance compared to the conductive regions 31. For any given width W of the conductive elements/regions, the braided switch of this third embodiment therefore has a much greater resistance change on stretch when compared to the second embodiment.

As in the second embodiment, the braided switch of the third embodiment is formed by placing corresponding ends or end regions of each conductive strip orthogonally, one on top of the other as shown in FIG. 3(a), then alternately folding each conductive strip back over the other, such that corresponding conductive regions 31 of each conductive strip lie atop each other (substantially parallel in the "on" state).

In yet other embodiments of a three-dimensional geometric switch, the switch may simply comprise a single elongate conductive strip folded back upon itself in alternate directions in an accordion or zigzag manner. Opposing faces of adjacent sections of the strip thus contact each other when the switch is compressed, but open as the switch is stretched by even a small amount.

Figure 4:
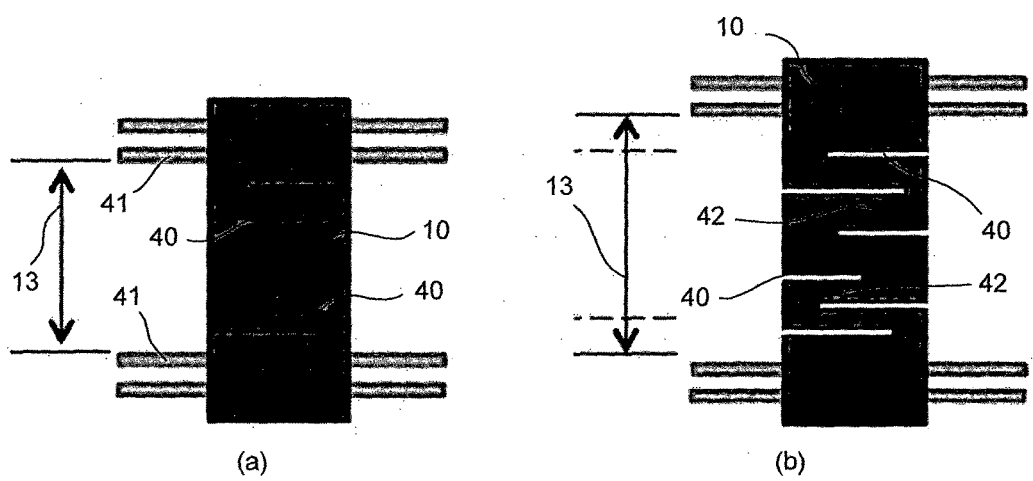
FIG. 4 is a diagram of a fourth embodiment of a switch according to the present invention, shown in: (a) relaxed; and (b) stretched states.

A fourth embodiment of the present invention is shown in FIG. 4 as an alternative to the planar GDES of the first embodiment. In this embodiment, the GDES comprises a thin silicone membrane 11 infiltrated with conducting carbon particles. A plurality of fine incisions or cuts 40 are provided along the length of the membrane 11 from alternating sides thereof, preferably extending inwardly over at least half, and more preferably approximately 75%-80%, of the width of the of the membrane substantially transverse to the intended direction of stretching as indicated by arrow 13. The GDES is clamped or fixed to contacts 41 at or adjacent opposing ends thereof.

The incisions 40 form openings in the conductive element which remain closed in the relaxed state, but open rapidly as the conductive element 10 is deformed towards the stretched state, thereby substantially changing the geometry of the conductive element.

In the relaxed low resistance or "on" state as shown in FIG. 4(a), the incisions 40 thus have little to no effect on the resistance of the GDES due to contact between the edges of adjacent channels formed by the incisions 40. That is, the cross-sectional area A of the conducting element 10 is effectively the width of the membrane W, multiplied by the thickness t of the conducting element.

In the stretched high resistance or "off" state as shown in FIG. 4(b), the incisions 40 open up, creating clearly defined channels 42 therebetween in the conductive element 10. The resistance of the conductive element 10 is thus a function of the thickness t of the conducting element, the number of incisions 40, and the width of the channels 42. As in the first embodiment, the conductive element is thus deformed from a substantially direct linear or planar conductive path in a relaxed state to a substantially elongated serpentine, meandering or tortuous conductive path in the stretched state, thereby disproportionately increasing the effective length and resistance of the conductive element. The membrane and conductive element preferably return to the relaxed "on" state when the deformation force is removed due to a mechanical bias effect of the elastic membrane 11.

Figure 5:
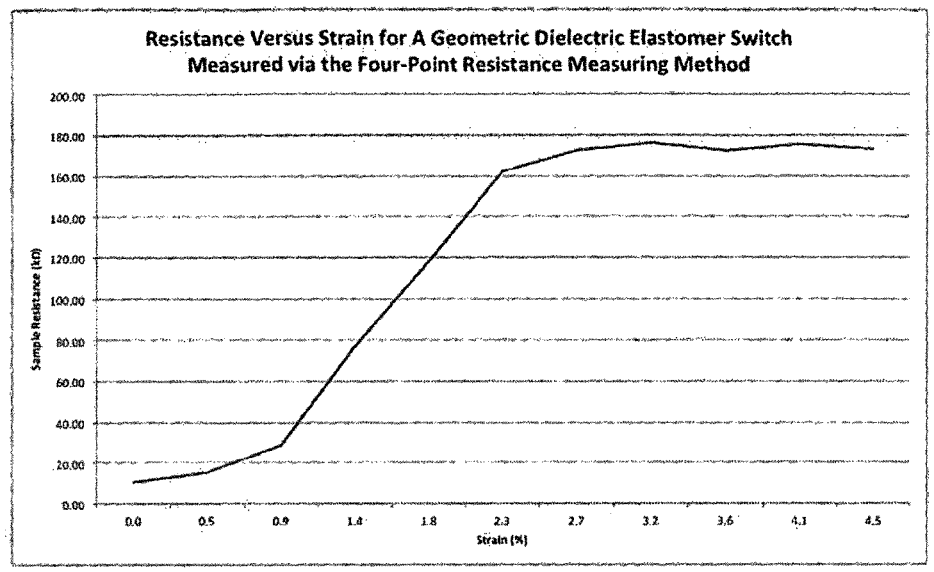
FIG. 5 is a plot of measured resistance versus strain for the switch of FIG. 4.

FIG. 5 shows a plot of the measured resistance against stretch of the fourth embodiment of FIG. 4. It can be seen from this plot that the resistance of the GDES increases disproportionately by a factor of approximately ten with a strain of just 3.0%. It can also be seen that the relationship between resistance and stretch/strain is highly non-linear due to the incisions opening up—the resistance increases particularly rapidly as the membrane is stretched from approximately 0.9% to 2.3% strain. In other embodiments, stretching the conductive element may cause a stepwise or near-stepwise change in resistance.

The embodiments of FIGS. 1 to 4 may in some cases suffer from drawbacks such as the need for complex machining and fabrication to produce the required geometric structures, and possible electrical sparking during stretching and/or relaxation of the membrane which occurs when the electric field strength exceeds the dielectric field strength of air. This sparking causes degradation and production of ozone and other gases, and may also pose a fire risk.

Figure 6:
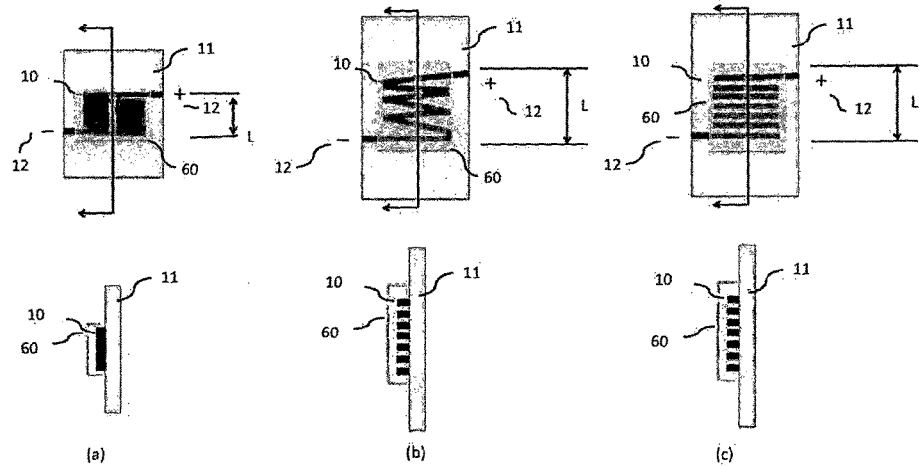
FIG. 6 is a diagram of a fifth embodiment of a switch according to the present invention, showing: (a) a relaxed state; (b) a stretched state; and (c) a variation of the fifth embodiment in which the conductive path becomes separated in the stretched state.

In a fifth example embodiment of the invention, the GDES of the first embodiment further comprises a compliant and relatively high-resistance encapsulation layer 60 atop the conductive element 10 which stretches with the membrane, as shown in FIG. 6.

The encapsulation layer 60 preferably comprises a material having electrical conductivity p lower than that of the conductive element 10, but higher than that of air to prevent sparking as the folds or channels of the conductive element open. That is, the encapsulation layer provides a relatively high-resistance conductive path between adjacent segments and/or the terminals 12 of the conductive element 10. The GDES of this fifth embodiment thus has a resistance in the "on" state, as shown in FIG. 6(a), substantially equivalent to the resistance of the conductive element 10 as in the previous embodiments, but the resistance in the "off" state, as shown in FIG. 6(b), is approximately equivalent to the resistance of the stretched encapsulation layer 60. The resistance of the encapsulation layer is preferably significant enough to effectively break or open the electrical circuit for practical purposes.

FIG. 6(c) illustrates a variation of the switches of FIGS. 1, 6(a) and 6(b). Here, the adjacent and substantially horizontal parallel segments of the conductive element 10 are not electrically connected at alternate ends to form a "zigzag" shape. Rather, the segments are spaced apart as the membrane is stretched, becoming isolated from each other. Accordingly, adjacent segments only contact and directly conduct current between each other when directly alongside each other, providing a contiguous low-resistance conductive path between electrodes 12. When stretched, as illustrated, current is conducted between adjacent segments of the conductive element 10 via the encapsulation layer 60. The geometry of the switch changes and the conductive element 10 is transformed from a substantially direct conductive path to a substantially separated high-resistance conductive path when the membrane is stretched.

In a sixth embodiment of the invention, the GDES comprises a membrane 11 provided with a conductive element 10 comprising a thin conductive layer of metal, by way of or sputtering for example.

The material used for the conductive element in any embodiment of the invention should ideally have the following properties:
1. Be easy to make with processes compatible with dielectric elastomer device fabrication;
2. Have consistent and predictable properties;
3. Change in resistance by many orders of magnitude when stretched by a small amount;
4. Not appreciably stiffen the membrane it is on;
5. It should be easy to electrically connect to other electronic components;
6. Be easy to pattern into the desired shape;
7. Last while switching high voltages;
8. Not spark;
9. Not degrade or change over time; and
10. Have low hysteresis.

Super thin metal layers can have these properties. They can be easily patterned using masking techniques and if thin enough do not impede stretching of the membrane. The metal layer naturally cracks in a substantially transverse direction upon stretching, thereby forming fissures which have been found to have the same effect as the "folds" or "incisions" of the first and fourth embodiments, or alternatively the isolated segments of the variation of the fifth embodiment shown in FIG. 6(c). That is, the fissures open and provide a substantially elongated tortuous or separated conductive path when the membrane is stretched (opening the fissures), and a shortened substantially direct conductive path across the fissures when the membrane is fully relaxed (closing the fissures). The geometry of the switch thus again changes significantly with a relatively small strain as the fissures open and close.

The switch of this embodiment may further comprise a plurality of elongate strips atop the conductive layer in the direction of stretching. These strips may be either conductive or non-conductive to ensure that the fissures provide one of a tortuous or separated conductive path, respectively, upon opening.

After applying the conductive layer or electrode to the membrane, it may be necessary to first stretch or over-stretch the membrane to form the required fissures before it can be used as a switch.

The membrane 11 may be pre-stretched before applying the conductive element or electrode, and the switch is then preferably operated with a reduced pre-stretch (or no pre-stretch) in the relaxed state to ensure that opposing sides of each fissure make contact and conduct.

Metal conductive layers have previously been considered unsuitable for the stretchable or compliant electrodes of dielectric elastomer devices due to their high increase in resistance with stretch. They have also previously been thought to be unsuitable for use as switches because they ablate when the high voltages typical of dielectric elastomer systems are applied, irreversibly damaging the device. Stretching a membrane having an implanted gold conductive layer under the application of a high voltage, for example, has been found to damage the conductive layer which thereafter does not return to its conducting state. Particular care is therefore required for some metals, while others may be simply impractical. It has been found that a metal which forms microscopic cracks or fissures, as opposed to larger cracks, will not spark or ablate when switching high voltages. This is thought to be because the cracks are too small to break down—i.e. any free charge carriers within a crack will just move from one side of the gap to the other without liberating any more charge carriers. In other words the mean free path of a liberated charge is more than the width of the crack, so avalanche breakdown cannot occur. This is a distributed example of a phenomenon known as Paschen's law which states that the voltage required to break down an air gap will decrease as the gap is decreased only up to a point. Beyond this point the voltage required for breakdown will decrease. Alternatively, or additionally, the suitability of such metals may be due to other effects such as particle separation, network, percolation, or other quantum mechanical effects.

The ideal electrode or conductive element is a thin metal layer having cracks that are small enough that spark ablation does not occur, but large enough so that the metal repeatably transitions from a conducting to a substantially non-conducting state when stretched a small amount. It has been found that a nanometre-scale layer of silver is particularly suitable and preferred in this sixth example embodiment of the invention.

An example of an available product which can be used as the membrane and conductive element of a switch according to the present invention is the PolyPower DEAP material available from Danfoss PolyPower A/S of Nordborg, Denmark. This material has previously only been used in dielectric elastomer transducers (actuators or generators). The suitability of the material for use in a switch is a result of the way in which the silver layer cracks upon stretching, as discussed above. This cracking has previously been thought to be a limitation, rather than a useful property, of the material.

According to a seventh embodiment of the present invention, a GDES of the sixth embodiment is preferably further provided with a high-resistance encapsulation layer atop the metal conductive layer to avoid ablation. With this encapsulation layer, the operating life of the switch may be extended and/or less durable materials may be used in the conductive layer.

The encapsulation layer may comprise a composition of carbon grease and non-conducting silicone grease in a ratio of between approximately 2:1 and 4:1, although other ratios, compositions and/or materials may alternatively be used without departing from the scope of the invention. Carbon loaded silicone may alternatively be cured to the surface of the conductive element, for example.

It will be appreciated by those skilled in the art that a switch according to invention can be combined with other elements to form an electric circuit device capable of a variety of useful functions. For example, one or more switches may be combined in circuits with other components such as resistors and DEDs to form logic circuitry, such as an inverter. This and other examples of such circuits using one or more DESs are set out in WO 2011/105913, the contents of which are incorporated herein by reference. The GDES of the present invention may be substituted for the DES of WO 2011/105913 to provide a variety of circuits/functions including, but not limited to, an AND gate, a NOT gate, a NAND gate, a voltage clamp, a diode, a summing junction, a neuron or weighted summing junction, a latch, a buffer, an operational amplifier, a frequency multiplier, a Schmitt trigger, an oscillator, or a low current driver, for example.

Figure 7:
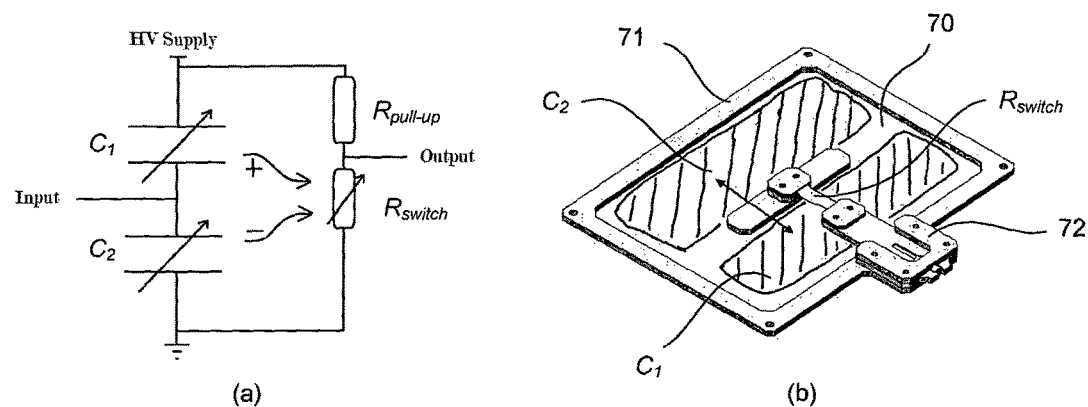
FIG. 7 shows (a) a circuit schematic; and (b) the physical arrangement of an inverter comprising a switch according to the present invention.

More particularly, FIG. 7 illustrates an inverter circuit and system comprising a pair of dielectric elastomer actuators (DEAs) in a dual-acting arrangement, mechanically coupled to a GDES according to the present invention. FIG. 7($a$) shows a schematic of the system illustrated in FIG. 7($b$), wherein the dielectric elastomer actuators are represented by variable capacitors $C_1$ and $C_2$, and the GDES switch is represented by variable resistor $R_{switch}$. The output of the circuit is a terminal provided between a pull-up resistor $R_{pull-up}$ of 50 MΩ, for example, and the GDES switch in a voltage-divider arrangement between the high voltage power supply and ground.

The diagram of FIG. 7($b$) illustrates a possible physical arrangement of the inverter system, wherein the first DEA $C_1$ compresses the switch $R_{switch}$ as it expands upon actuation, and the second DEA $C_2$ stretches the switch upon actuation. Both of the first and second DEAs are in this example provided on a single membrane 70 secured in a rigid frame 71. The GDES switch $R_{switch}$ (which in this example includes a second, separate, membrane or substrate) is clamped between the centre of DEA membrane 70 and the outer frame 71, with an adjustment mechanism 72 permitting adjustment of the mechanical coupling.

When the input to the inverter circuit is low, the first DEA $C_1$ is actuated and expands. This expansion stretches the GDES switch $R_{switch}$, significantly increasing its resistance (well in excess of the pull-up resistor $R_{pull-up}$). The output of the circuit is thus pulled high by the pull-up resistor $R_{pull-up}$. The GDES switch can therefore be said to couple the HV Supply input to the output terminal of the circuit.

When the input to the inverter is high, the second DEA $C_2$ is actuated and expands, compressing or relaxing the GDES switch $R_{switch}$ and significantly reducing its resistance with respect to the stretched state (well below the resistance of the pull-up resistor $R_{pull-up}$). The output of the inverter circuit is thus pulled low by the GDES switch, which decouples the HV Supply input from the output terminal of the circuit.

The adjustment mechanism 72 allows precise over-stretching of the GDES switch and tuning of the stretch state of each switch (i.e. biasing the switch towards the required operating point to ensure correct operation of the inverter). The adjustment mechanism includes a bolt which engages a nut in the cantilevered arm so that when it is turned the arm moves in and out and stretches the switch clamped between the arm and the centre of the membrane 70.

Figure 8:
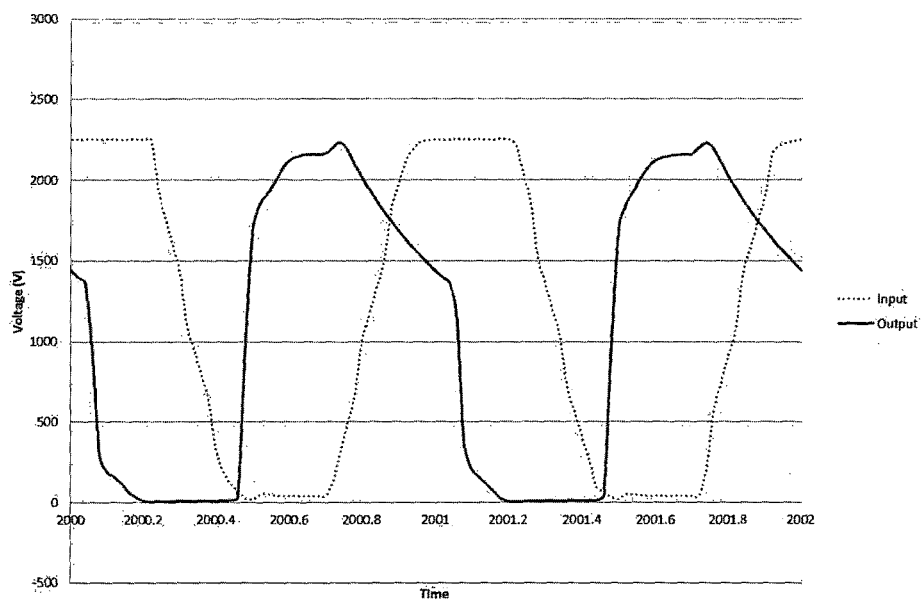
FIG. 8 shows the results of a prototype inverter similar to that shown in FIG. 7.

FIG. 8 shows the result of testing a prototype inverter similar to that of FIG. 7, in which it can be seen that the output signal is the inverse of the input signal (subject to a short delay).

Figure 9:
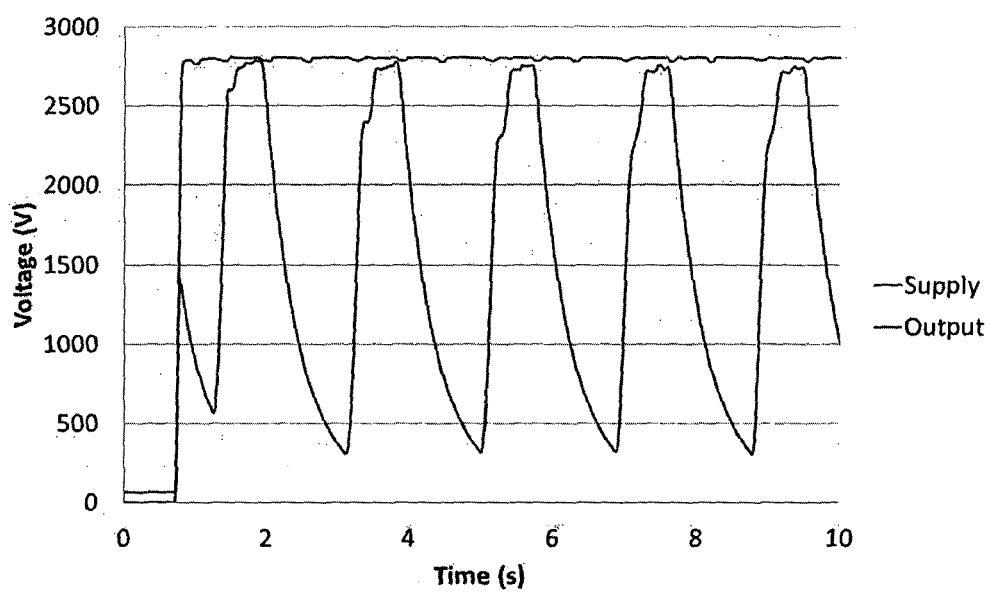
FIG. 9 shows the results of a prototype ring oscillator comprising three inverters as shown in FIG. 7.

An odd number of the inverter circuits of FIG. 7 may be coupled together into a ring oscillator. FIG. 9 shows the result of testing a ring oscillator comprising three prototype inverter circuits as described above, with GDES switches according to the fifth embodiment of the invention.

In testing the inverter circuit, each switch was 10 mm long at rest and was then stretched under the measurement of a multimeter until it stopped conducting. The adjustment mechanism was then wound back in so that the equilibrium or operation stretch state comprised an approximate 20% pre-stretch. As described above, each inverter was dual acting to alternately transition between compressing and stretching the switch. As shown in FIG. 9, the prototype ring oscillator successfully operated at a frequency of 0.5 Hz.

Figure 10:
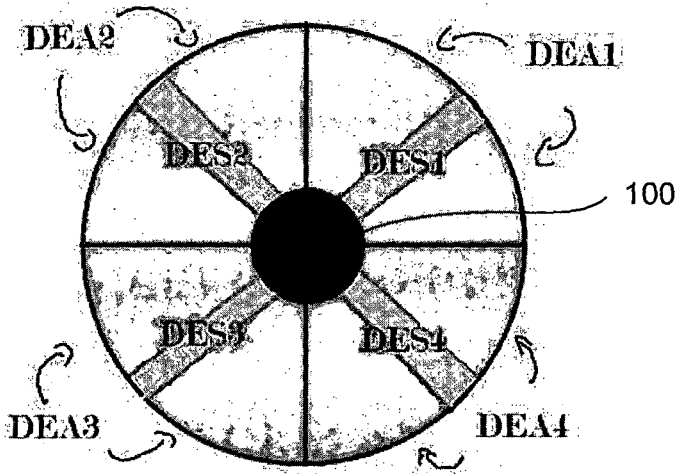
FIG. 10 shows (a) a diagram of the physical arrangement; and (b) a partial circuit schematic of a four-phase self-commutating dielectric elastomer motor incorporating four switches according to the present invention.
Figure 10:
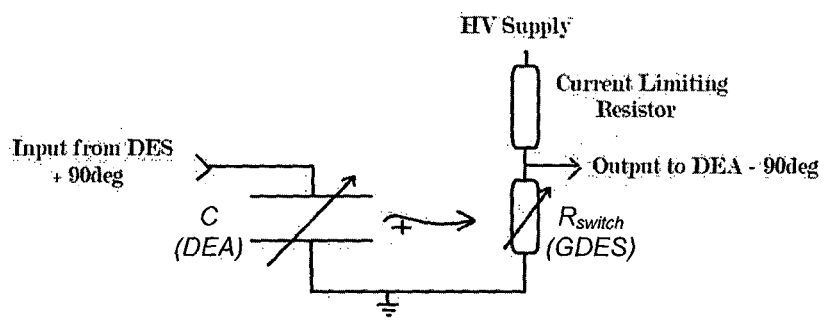

FIG. 10 illustrates a further example application of the GDES switches of the present invention, in the form of a four-phase self-commutating dielectric elastomer oscillator or motor. FIG. 10($a$) shows a diagram of the motor, in which it can be seen that the motor comprises four DEAs (DEA1-DEA4) and four switches (DES1-DES4). FIG. 10($b$) shows the connections between a single DEA and GDES, and their relationship with the other components of the motor. Each DEA is electrically actuated by a switch mechanically actuated by an adjacent DEA, and in turn mechanically actuates a switch which electrically actuates the next adjacent DEA, and so on. The switches and DEAs thereby sequentially actuate each other, causing the central mass 100 to oscillate in plane. The DEAs and GDES may be integrated on a single dielectric elastomer membrane, so that no external circuitry (other than a power supply) is required to provide control of the basic operation of the DEAs.

The switches of the present invention may be used in a variety of complex systems, in particular to control dielectric elastomer devices. The switches themselves are flexible and can be integrated with dielectric elastomer devices by fabrication on a common membrane, and the overall system therefore may be configured to be flexible, removing system design constraints of the more traditional rigid switches of the prior art. However, the invention is not necessarily limited to applications involving other dielectric elastomer devices.

From the foregoing it will be seen that a geometric switch is provided which provides a greatly increased resistance upon mechanical actuation stretching the membrane due to a change in geometry or shape with only very limited strain. The switch is lightweight and flexible. At least some embodiments of the switch can be easily provided on the dielectric membrane of a dielectric elastomer device (DED) using similar processes as are used in the fabrication of DEDs, thereby forming an important part of cost-effective "soft" control electronics.

Unless the context clearly requires otherwise, throughout the description, the words "comprise", "comprising", and the like, are to be construed in an inclusive sense as opposed to an exclusive or exhaustive sense, that is to say, in the sense of "including, but not limited to".

Although this invention has been described by way of example and with reference to possible embodiments thereof, it is to be understood that modifications or improvements may be made thereto without departing from the scope of the invention. The invention may also be said broadly to consist in the parts, elements and features referred to or indicated in the specification of the application, individually or collectively, in any or all combinations of two or more of said parts, elements or features. Furthermore, where reference has been made to specific components or integers of the invention having known equivalents, then such equivalents are herein incorporated as if individually set forth.

Any discussion of the prior art throughout the specification should in no way be considered as an admission that such prior art is widely known or forms part of common general knowledge in the field.

The invention claimed is:

1. A mechanically-actuated switch comprising a deformable conductive element providing a conductive path between a first terminal and a second terminal, wherein an effective cross sectional area of the conductive element changes suddenly upon deformation to cause a disproportionately large change in a resistance between the first and second terminals.

2. The switch of claim 1 further comprising a deformable conductive encapsulation layer electrically coupled with the conductive element to prevent electrical sparking.

3. The switch of claim 1, wherein the conductive element is deformable between a first state in which the effective length of the conductive path is substantially equal to a spacing between the first and second terminals, and a second state in which the effective length of the conductive path is substantially greater than the spacing between the first and second terminals.

4. The switch of claim 3, wherein the conductive element is mechanically biased towards one of the first or second states.

5. The switch of claim 1, wherein the conductive element is deformable between a first state in which the conductive path is a substantially direct path between the first and second terminals, and a second state in which the conductive path is a substantially elongated tortuous path between the first and second terminals.

6. The switch of claim 1, wherein deformation of the conductive element in a first direction substantially elongates the effective length of the conductive path in a substantially transverse second direction.

7. The switch of claim 1, wherein deformation of the conductive element causes a substantially stepwise-like change in the resistance.

8. The switch of claim 1, wherein the conductive element comprises a plurality of connected elongate segments in a zigzagging arrangement whereby each segment is adapted to contact and conduct with adjacent segments along substantially their entire lengths to provide a shortened conductive path when the membrane is in a first state, and to deform to a substantially elongated tortuous conductive path when the conductive element is deformed to a second state.

9. The switch of claim 1, wherein the conductive element comprises a plurality of substantially parallel transverse segments whereby each segment is adapted to contact and conduct with adjacent segments when the conductive element is in a first state to provide a conductive path, and to separate when the conductive element is deformed to a second state.

10. The switch of claim 9 further comprising a conductive encapsulation layer electrically coupled with the plurality of segments of the conductive element, the encapsulation layer providing an alternative conductive path between said separated segments in the second state to prevent electrical sparking.

11. The switch of claim 1, wherein the conductive element comprises a compliant conductive layer mechanically coupled with a deformable membrane, the conductive layer comprising a plurality of incisions extending inwardly from alternate sides of the conductive element, said incisions being adapted to remain closed whereby the conductive element conducts current across one or more of the incisions in a first state, and to open when the conductive element is deformed to a second state to provide a substantially elongated tortuous conductive path.

12. The switch of claim 11 wherein the plurality of incisions extend into or through the membrane.

13. The switch of claim 1, wherein the conductive element comprises at least one elongate planar conductive strip folded back upon itself in alternate directions, wherein adjacent folded sections of the conductive strip are adapted to contact and conduct current substantially in a through-plane direction to provide a shortened conductive path when compressed, and to provide a substantially elongated tortuous conductive path when extended.

14. The switch of claim 1, wherein the conductive element comprises a conductive metal layer upon or within a deformable membrane, the conductive metal layer comprising a plurality of fissures adapted to remain closed when the conductive element is in a first state to provide a substantially linear or planar conductive path between the first and second terminals, and to open when the conductive element is deformed to a second state to provide a substantially tortuous and/or separated conductive path.

15. The switch of claim 14 further comprising a conductive encapsulation layer electrically coupled with the conductive element and providing a high-resistance alternative conductive path across said fissures in the second state to prevent electrical sparking.

16. A circuit comprising a switch having a deformable conductive element providing a conductive path between a first terminal and a second terminal, wherein an effective cross sectional area of the conductive element changes suddenly upon deformation to cause a disproportionately large change in a resistance between the first and second terminals; an input, and an output, wherein the circuit is configured to provide at the output an output signal dependent upon at least an input signal received at the input and the deformation of the conductive element of the switch.

17. The circuit of claim 16 further comprising at least one dielectric elastomer device mechanically and/or electrically coupled with the switch; wherein the dielectric elastomer device comprises a pair of electrodes on either side of a dielectric membrane, and the conductive element of the switch is mechanically coupled with the dielectric membrane.

18. The circuit of claim 16 further comprising a dielectric elastomer actuator (DEA) mechanically coupled with the switch, wherein the switch is actuated by the DEA.

19. The circuit of claim 16 further comprising a dielectric elastomer actuator (DEA) electrically coupled with the switch, wherein actuation of the DEA is controlled by the switch.

20. The circuit of claim 16 configured as a circuit selected from the group consisting of an inverter, ring oscillator, oscillating motor, AND gate, NOT gate, NAND gate, voltage clamp, diode, summing junction, neuron or weighted summing junction, latch, buffer, operational amplifier, frequency multiplier, Schmitt trigger and low current driver.

21. A method for controlling a circuit, comprising steps of:

providing the circuit with a switch having a deformable conductive element providing a conductive path between a first terminal and a second terminal, wherein an effective cross sectional area of the conductive element changes suddenly upon deformation to cause a disproportionately large change in a resistance between the first and second terminals;

providing an input signal to the switch; and subjecting the switch to a deformation force, thereby actuating said switch and producing an output signal dependent upon at least the input signal and deformation of the switch.

* * * * *